United States Patent
Kaido et al.

(10) Patent No.: US 8,049,559 B2
(45) Date of Patent: Nov. 1, 2011

(54) SEMICONDUCTOR DEVICE, RADIO FREQUENCY CIRCUIT, AND RADIO FREQUENCY POWER AMPLIFIER

(75) Inventors: Junji Kaido, Osaka (JP); Masahiko Inamori, Osaka (JP); Shinichi Sonetaka, Osaka (JP); Hiroaki Kawano, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/833,536

(22) Filed: Jul. 9, 2010

(65) Prior Publication Data

US 2011/0012680 A1    Jan. 20, 2011

(30) Foreign Application Priority Data

Jul. 17, 2009    (JP) .................... 2009-168865

(51) Int. Cl.
*H03F 3/00* (2006.01)
(52) U.S. Cl. ....................... 330/148; 330/307
(58) Field of Classification Search .................. 330/148, 330/307, 285, 296
See application file for complete search history.

(56) References Cited

U.S. PATENT DOCUMENTS

| | | | |
|---|---|---|---|
| 5,748,053 A | 5/1998 | Kameyama et al. | |
| 6,674,131 B2 * | 1/2004 | Yokogawa et al. | 257/379 |
| 7,476,935 B2 * | 1/2009 | Kumagai et al. | 257/343 |
| 7,714,360 B2 * | 5/2010 | Otsuka et al. | 257/194 |
| 7,834,380 B2 * | 11/2010 | Ueda et al. | 257/192 |
| 2005/0047038 A1 | 3/2005 | Nakajima et al. | |
| 2005/0263799 A1 | 12/2005 | Nakatsuka et al. | |
| 2010/0081410 A1 | 4/2010 | Kaido et al. | |

FOREIGN PATENT DOCUMENTS

| | | |
|---|---|---|
| JP | 2005-72671 | 3/2005 |
| JP | 4202852 | 12/2008 |
| JP | 2010-81383 | 4/2010 |

\* cited by examiner

*Primary Examiner* — Henry Choe
(74) *Attorney, Agent, or Firm* — Greenblum & Bernstein, P.L.C.

(57) ABSTRACT

A semiconductor device and a radio frequency circuit which are appropriate for multiband, multimode performance can be realized as a semiconductor device including a field-effect transistor formed on a semiconductor substrate, and include: ohmic electrodes serving as source and drain electrodes of the field-effect transistor, first and second Schottky electrodes provided between the ohmic electrodes and serving as gate electrodes of the field-effect transistor, and a third Schottky electrode provided and grounded between the first and second Schottky electrodes.

14 Claims, 14 Drawing Sheets

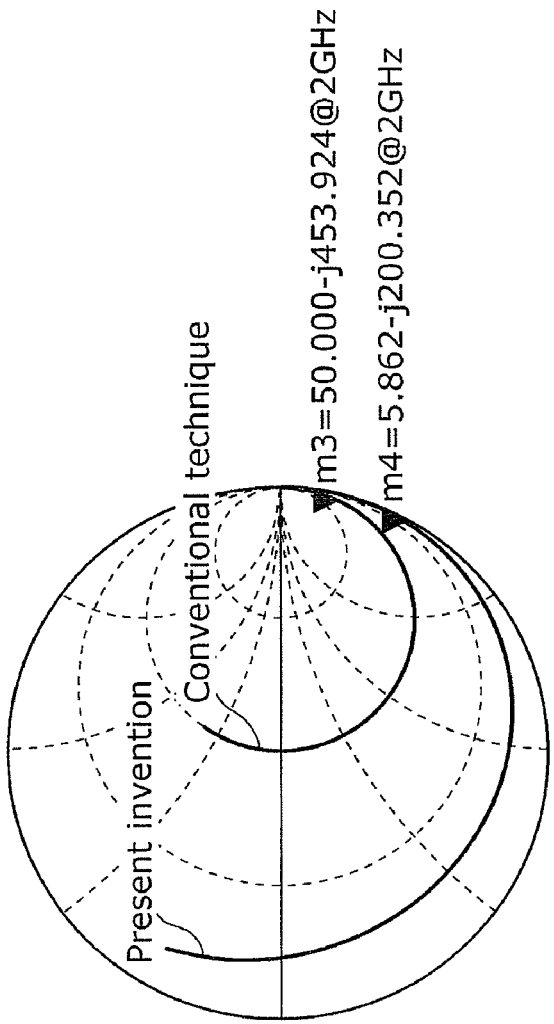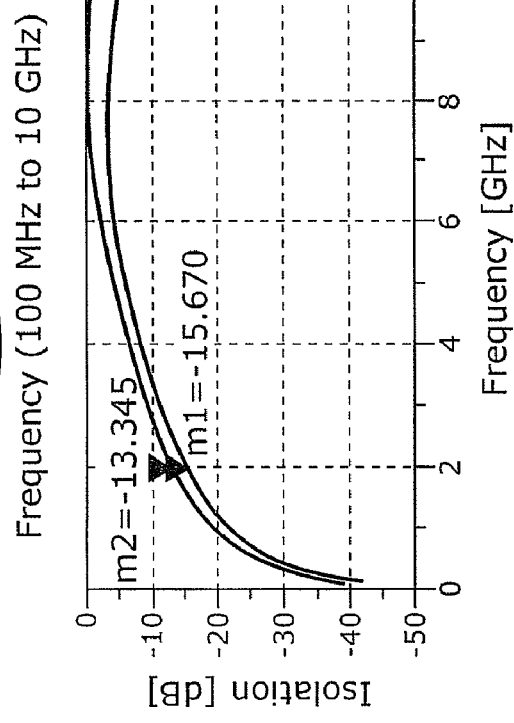
FIG. 4A
FIG. 4B

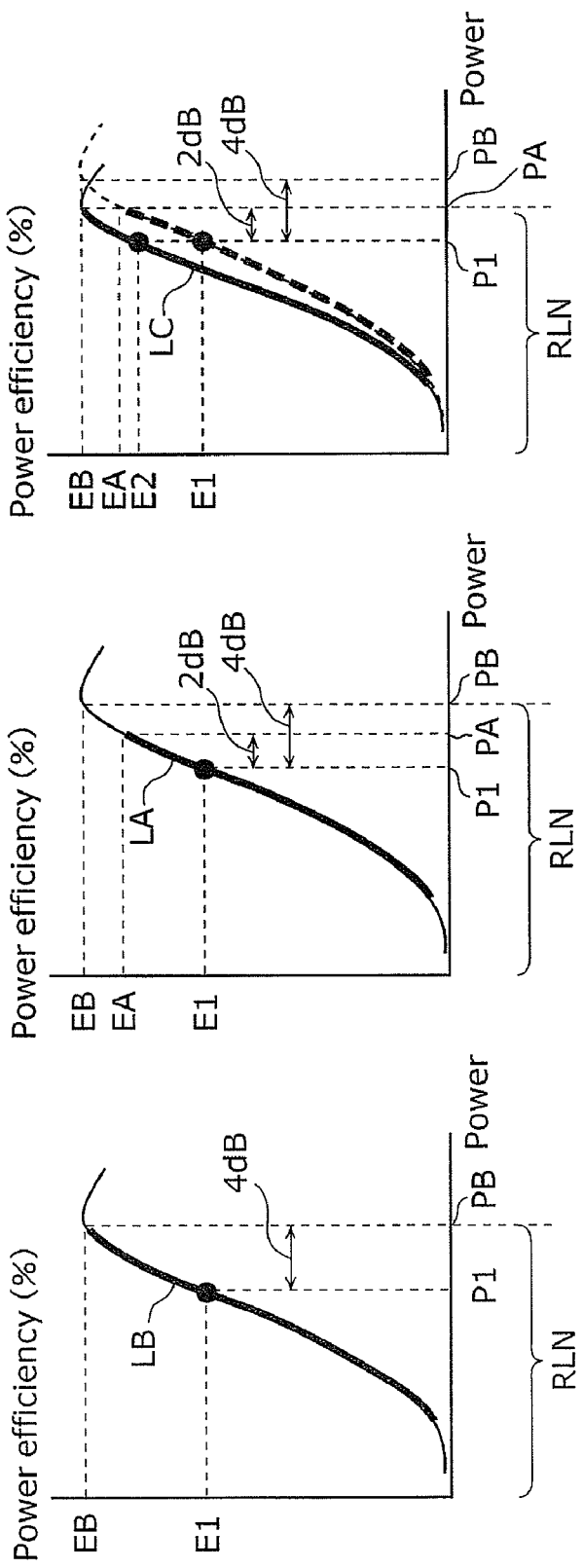

US 8,049,559 B2

SEMICONDUCTOR DEVICE, RADIO FREQUENCY CIRCUIT, AND RADIO FREQUENCY POWER AMPLIFIER

BACKGROUND OF THE INVENTION (1) Field of the Invention

The present invention relates to a switch circuit which switches signals in a mobile communication device or the like and a technique used for a radio frequency power amplifier, and relates more specifically to a semiconductor device, a radio frequency circuit, and a radio frequency power amplifier.

(2) Description of the Related Art

Recently, cellular phones have been further equipped with multiband, multimode compatibility, with a demand growing for higher performance (lower loss) of a radio frequency switch using a field-effect transistor (FET). However, the radio frequency switch using the FET has a disadvantage of degrading isolation (inter-element isolation) characteristics at the time of supplying a large amount of power, and a technique of connecting plural FETs in series is used to improve this status. In this context, a switch circuit whose isolation characteristics are enhanced through multigate configuration has been proposed (for example, see Patent Reference 1: Japanese Patent No. 4202852).

FIG. 1 is a diagram showing a configuration of a switch circuit described in Patent Reference 1.

A conventional switch circuit shown in FIG. 1 includes: a switch transistor Q1 connected between a transmission-side terminal TX and a common terminal COM, and a switch transistor Q2 connected between the common terminal COM and a reception-side terminal Rx. Here, the transmission-side terminal Tx is connected to an output terminal of a power amplifier provided outside the diagram, the common terminal COM is connected to an antenna provided outside the diagram, and the reception-side terminal RX is connected to an input terminal of the receiving system circuit provided outside the diagram.

Depression-type HEMTs are used for the switch transistors Q1 and Q2, and each of the depression-type HEMTs is configured as a triple-gate element which includes three gate electrodes each corresponding to one channel.

This triple-gate structure allows the channel to be shorter due to absence of a region where source and drain electrode are supposed to be formed between adjacent gate regions, and also allows reducing on-resistance Ron due to absence of source and drain resistors, thus allowing reduction of insertion loss.

However, in this structure, when turning off the switch transistors Q1 and Q2 included in the conventional switch circuit, depletion layer capacitors directly beneath the multiple gates are connected in series. This does not allow reducing impedance of an off-channel, thus causing a problem of insufficient isolation between both ends of the off-channel.

In addition, when using, in a load circuit of a multiband, multimode power amplifier, the conventional switch circuit as a transmission line selection circuit which selects a transmission line according to each band or mode, the conventional switch circuit is not capable of converting the load impedance, thus causing another problem of degradation of efficiency characteristics of the power amplifier. Therefore, it can be said that the conventional switch circuit is not appropriate for multiband, multimode performance.

SUMMARY OF THE INVENTION

The present invention, conceived in view of the above problems, is to solve the problem of insufficient isolation as a result of using only series connection of the depletion layer capacitors and the problem of incapability of load impedance conversion.

In other words, the object of the present invention is to provide a semiconductor device which is formed using a multigate FET, and which can realize satisfactory isolation characteristics and can also convert load impedance appropriately when used as a transmission selection circuit in a load circuit of a power amplifier, and to provide a radio frequency circuit using the semiconductor device.

To solve the problem described above, a semiconductor device according to an aspect of the present invention is a semiconductor device including a field-effect transistor formed on a semiconductor substrate, and the semiconductor device includes: a first ohmic electrode and a second ohmic electrode serving as a source electrode and a drain electrode of the field-effect transistor; a first Schottky electrode and a second Schottky electrode which are provided between the first and the second ohmic electrodes and serve as gate electrodes of the field-effect transistor; and a third Schottky electrode provided between the first and the second Schottky electrodes, and the third Schottky electrode is grounded.

In addition, the first Schottky electrode and the second Schottky electrode may be connected to each other.

In addition, an injection-doped layer may be formed directly beneath the third Schottky electrode.

The radio frequency circuit according to the aspect of the present invention includes: an amplifying circuit which amplifies a radio frequency signal and outputs the amplified signal; a capacitor having a first end connected to an output of the amplifying circuit; and a plurality of semiconductor devices each being the semiconductor device described above, and each of the plurality of semiconductor devices has the first ohmic electrode connected to the second end of the capacitor.

The radio frequency circuit may further include: a detector which detects an amount of predetermined characteristics of the amplified signal; and a controller which turns on one of field-effect transistors according to the amount of the predetermined characteristics detected by the detector and which turns off the others, the field-effect transistors being included in the plurality of semiconductor devices.

The detector may detect one of a frequency, an average power, and a peak power of the amplified signal as the amount of the predetermined characteristics.

The radio frequency circuit may further include a bias circuit which supplies, to the amplifying circuit, a bias output representing a bias current or a bias voltage according to the average power or the peak power of the amplified signal detected by the detector, and may further include a supply circuit which supplies, to the amplifying circuit, a supply voltage according to the average power or the peak power of the amplified signal detected by the detector.

In addition, according to an aspect of the present invention, it is also possible to realize a radio frequency power amplifier in which, in the radio frequency circuit described above, the field-effect transistors and at least part of the amplifying circuit are formed on the semiconductor substrate.

According to the present invention, it is possible to solve the conventional problems of insufficient isolation caused by using only series connection of off-capacitors and of incapability of load impedance conversion, and to provide a semiconductor device and a radio frequency power amplifier appropriate for multiband, multimode performance.

Further Information about Technical Background to this Application

The disclosure of Japanese Patent Application No. 2009-168865 filed on Jul. 17, 2009 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 4A is a diagram comparing input impedance between the switch circuit according to the first embodiment of the present invention and a conventional switch circuit;

FIG. 4B is a diagram comparing isolation between the switch circuit according to the first embodiment of the present invention and the conventional switch circuit;

FIG. 13A is a characteristics diagram indicating power efficiency in generating the amplified signal shown in 12B;

FIG. 13B is a characteristics diagram indicating power efficiency in generating the amplified signal shown in 12A;

FIG. 13C is a characteristics diagram indicating power efficiency in decreasing a range of linear operation RLN, from a peak power PB or less to a peak power PA or less.

DESCRIPTION OF THE PREFERRED EMBODIMENTS

Figure 1:
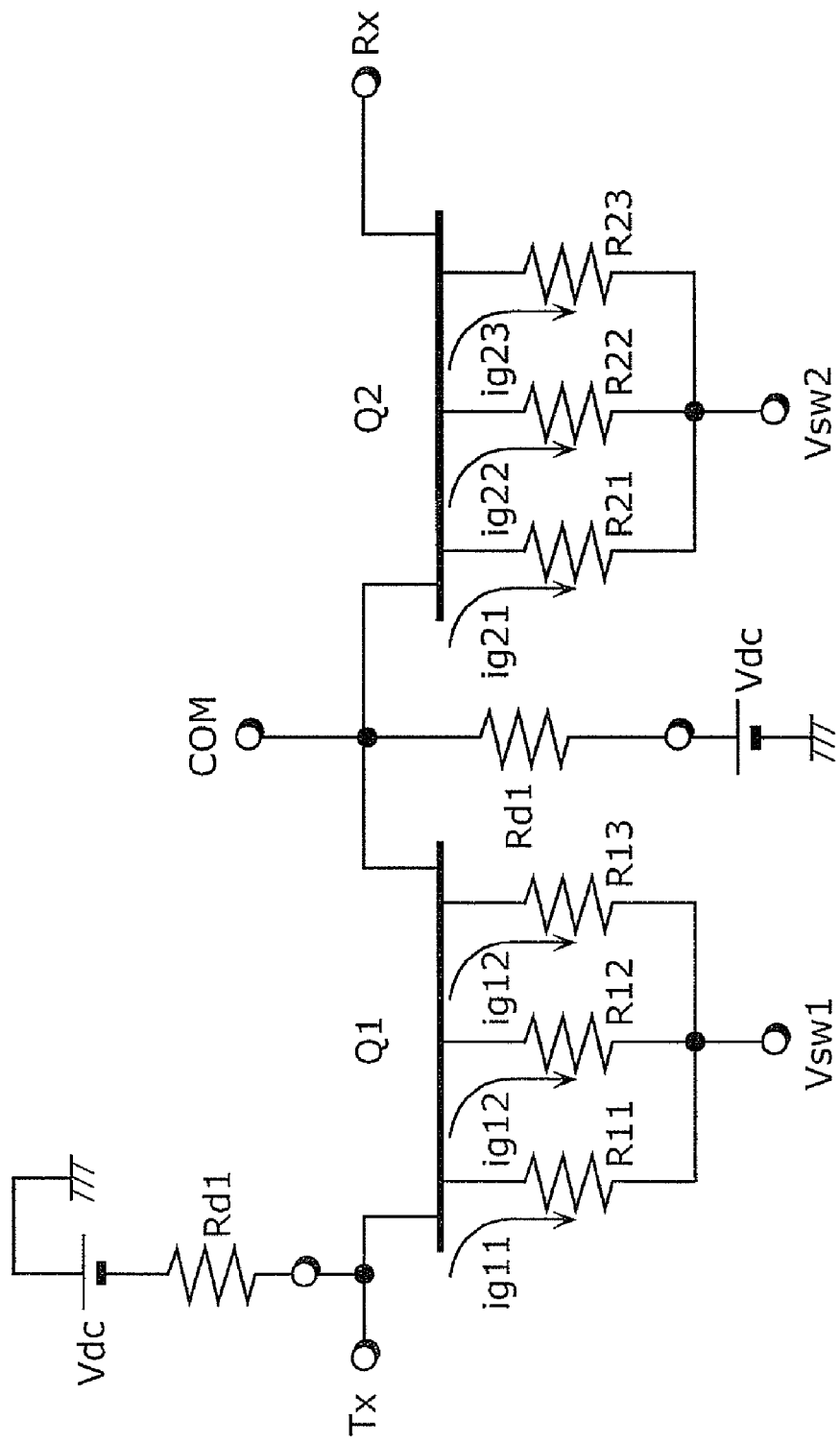
FIG. 1 is a diagram showing a configuration of a switch circuit disclosed in Patent Reference 1.

Hereinafter, embodiments according to the present invention will be described with reference to the drawings. Note that in the drawings, elements representing substantially the same configuration, operation, and advantageous effect are assigned with the same numeral. In addition, all the values hereafter described are mere examples to specifically describe the present invention, and the present invention is not limited by the values hereafter described. Furthermore, in each of the embodiments, a connection relationship between constituent elements is given as a mere example to specifically describe the present invention, and the connection relationship which realizes the function according to the present invention is not limited to such a connection relationship.

In addition, each constituent element in each of the embodiments is configured using hardware and/or software, but a constituent element using hardware is also configurable using software, or a constituent element using software is also configurable using hardware.

First Embodiment

In a first embodiment, a semiconductor device appropriate for improving isolation will be described as an example.

Figure 2:
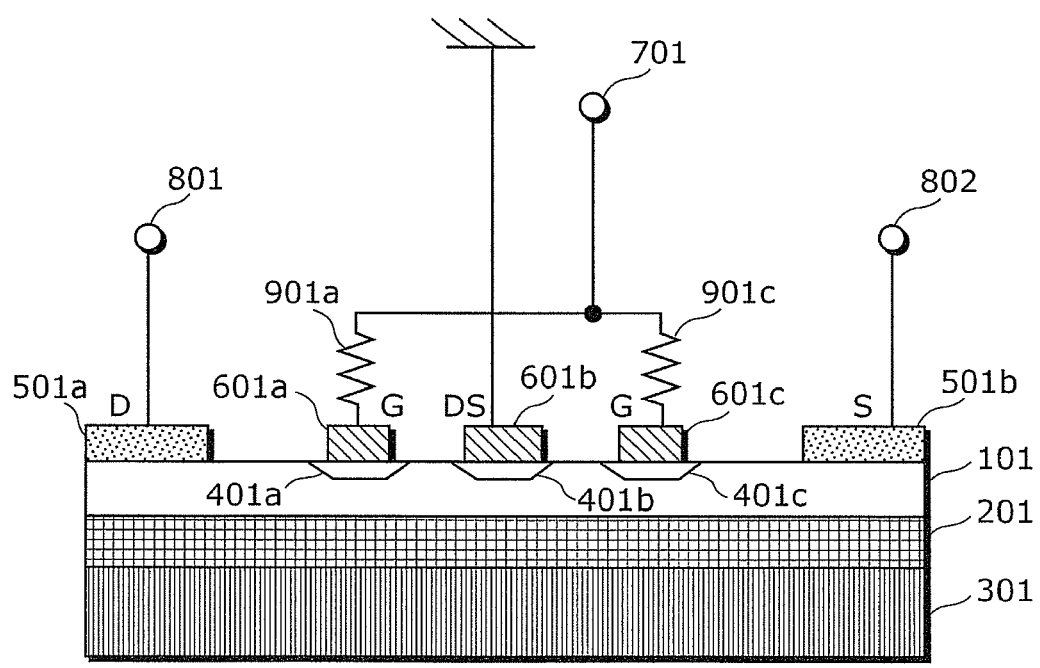
FIG. 2 is a cross-sectional diagram of a semiconductor device according to a first embodiment of the present invention.

FIG. 2 shows a metal semiconductor field-effect transistor (MESFET) as a semiconductor device according to the first embodiment. In FIG. 2, the semiconductor device according to the present embodiment includes: a cap layer 101, a channel layer 201, a semiconductor substrate 301, depletion layers 410a to 401c, ohmic electrodes 501a and 501b, Schottky electrodes 601a to 601c, bias terminals 701, 801, and 802, and gate terminal resistors 901a and 901c.

FIG. 2 shows a configuration in which the channel layer 201 and the cap layer 101 are formed on the semiconductor substrate 301. In addition, the ohmic electrodes 501a and 501b serving as a source and a drain and the Schottky electrodes 601a to 601c serving as gates are formed on the cap layer 101.

In the conventional technique, a multigate FET as shown in FIG. 2 is used by applying the same potential to the Schottky electrodes 601a to 601c; however, in the present invention, such a multigate FET is caused to operate with the Schottky electrode 601b grounded between the two Schottky electrodes 601a and 601c.

In actual use, a radio frequency signal is input from the bias terminal 801 and is extracted from the bias terminal 802.

When turning on the switch (electrically connecting bias terminals 801 and 802), a direct-current (DC) voltage 0 V is applied to the bias terminals 801 and 802 serving as a source and a drain, and a DC voltage 0.5 V is applied from the bias terminal 701 to the Schottky electrodes 601a and 601c serving as gates, so as to reduce the depletion layers 401a and 401c and pass the radio frequency signal.

In contrast, when turning off the switch (disconnecting the bias terminal 801 from the bias terminal 802), a direct-current (DC) voltage 0 V is applied to the bias terminals 801 and 802 serving as the source and the drain, and a DC voltage −3 V is applied to the Schottky electrodes 601a and 601c serving as the gates, so as to increase widths of the depletion layers 401a and 401c and block the radio frequency signal. In addition, under the Schottky electrode 601b that is grounded, a depletion layer 401b which is maintained by diffusion potential is formed.

Figure 3:
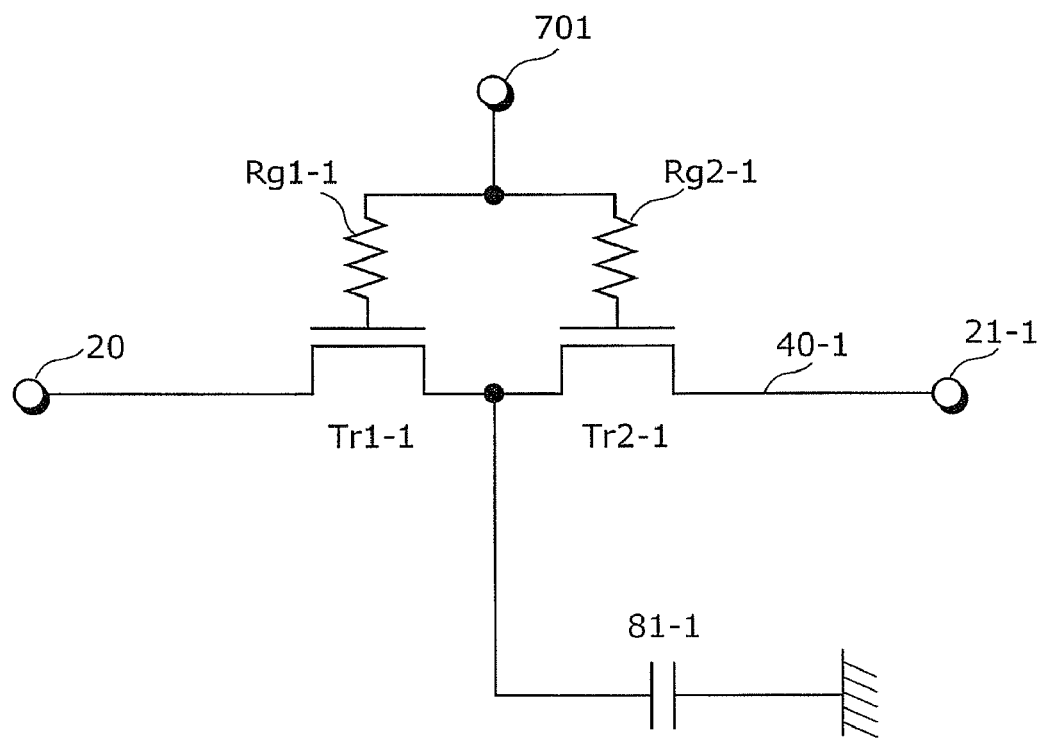
FIG. 3 is an equivalent circuit diagram of a semiconductor device according to the first embodiment of the present invention.

Described below with reference to FIG. 3 is a principle of improving isolation characteristics of the semiconductor device in FIG. 2 as compared to the case of conventional use. Here, the conventional use is to apply the same potential to the Schottky electrodes 601a to 601c without grounding the Schottky electrode 601b.

FIG. 3 shows a Single Pole Single Throw switch circuit including an input terminal 20, an output terminal 21-1, and a transmission line 40-1, as an equivalent circuit diagram of the semiconductor device in FIG. 2. In contrast, an equivalent circuit diagram according to the conventional technique is represented by, for example, Q1 or Q2 in FIG. 1.

In order to use the Schottky electrodes 601a and 601c in FIG. 2 as the gates, a two-stage configuration including switch transistors Tr1-1 and Tr2-1 is adapted, and the switch transistors Tr1-1 and Tr2-1 are connected to gate resistors Rg1-1 and Rg2-1, respectively, so as to be connected to the bias terminal 701.

Since the Schottky electrode 601b is grounded, a depletion layer is formed directly beneath the Schottky electrode 601b. When this depletion layer is represented as a capacitor, the equivalent circuit is to include, as shown in FIG. 3, a depletion layer capacitor 81-1 between Tr1-1 and Tr2-1.

The switch transistors Tr1-1 and Tr2-1 are represented as resistance components when they are on, and as capacitance components when they are off. Since isolation characteristics are manifested when the switch is off, the switch transistors Tr1-1 and Tr2-1 are considered as capacitors. Note that the capacitance component when the switch is off (off-capacitance) is a constant which depends on a device size of the switch transistor to be used. Here, as an example, the off-capacitance per switch transistor is assumed to be approximately 0.5 pF, but the present embodiment is not limited to this.

FIGS. 4A and 4B show results of calculating and comparing isolation according to the conventional technique and isolation according to an implementation of the present invention. The calculation is based on the condition that: off-capacitance is 0.5 pF, and the radio frequency signal has frequency of 100 MHz to 10 GHz.

FIG. 4A is a chart indicating impedance characteristics in the present invention (the equivalent circuit in FIG. 3) and in the conventional technique, and FIG. 4B is a graph indicating isolation characteristics in the present invention (the equivalent circuit in FIG. 3) and in the conventional technique.

In FIG. 4A, when the frequency of the input signal is 2 MHz, an input impedance m3 in the conventional technique is 50.0-j453.9$\Omega$, and an input impedance m4 in the present invention is 5.8-j200.3$\Omega$. In an implementation of the present invention, this difference is caused due to presence of a ground capacitor, which causes the input impedance to rotate toward a lower end.

In addition, in FIG. 4B, when the frequency of the input signal is 2 MHz, isolation m2 in the conventional technique is 13.3 dB, and isolation m1 in the present invention is 15.6 dB, which shows an improvement by 2 dB or more.

In addition, the depletion layer capacitor 81-1 in FIG. 3 (capacitance of the depletion layer 401b in FIG. 2) varies according to a value of a bias voltage applied to the bias terminal 701. This is because the depletion layer in the Schottky barrier has a width which varies depending on the bias voltage.

As described above, according to the first embodiment, it is possible, by grounding the Schottky electrode 601b, to reduce the input impedance through a variable depletion layer capacitor which is formed according to ground potential. Thus, according to the first embodiment, it is possible to provide a semiconductor device appropriate for multiband, multimode performance.

Second Embodiment

Figure 5:
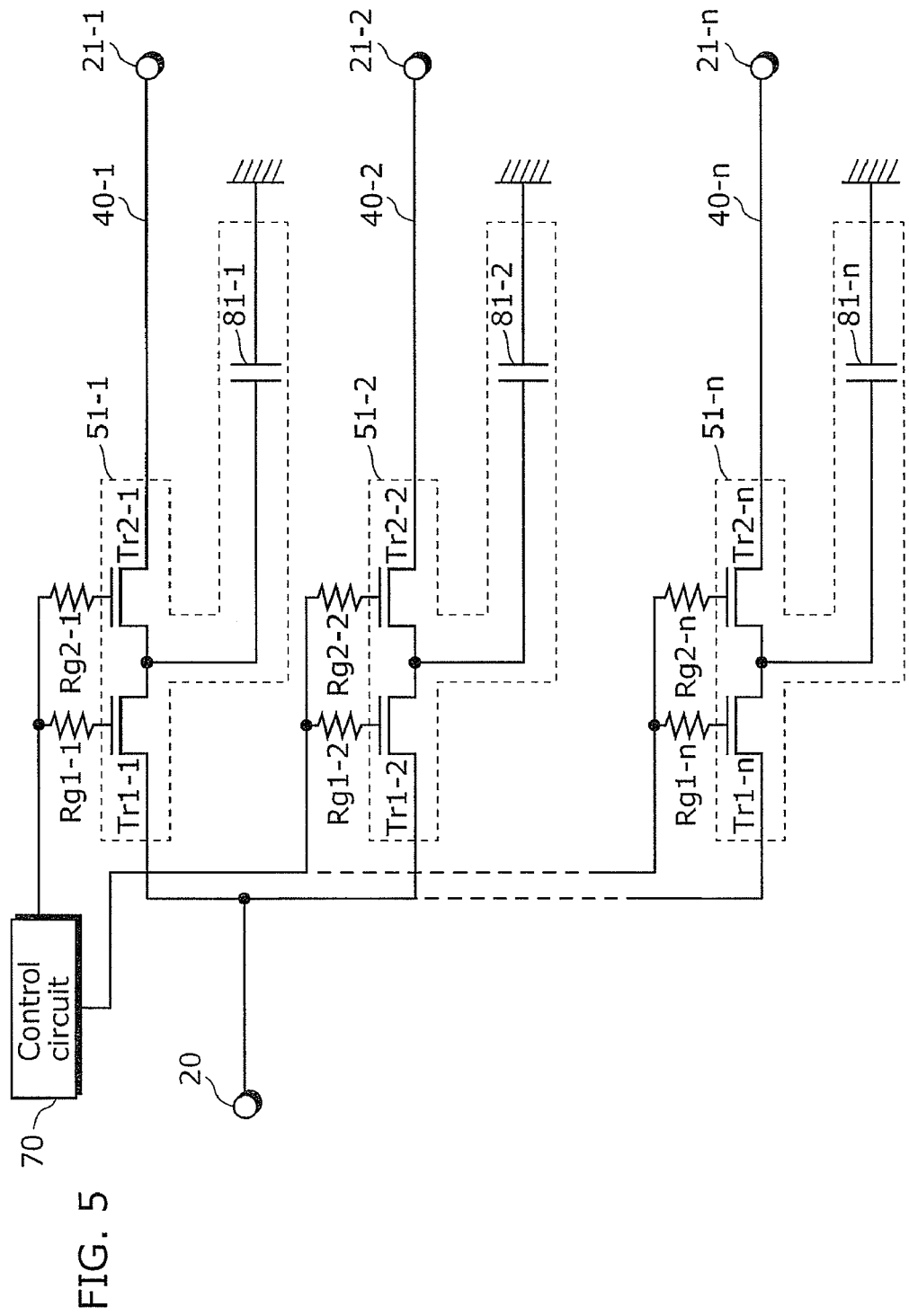
FIG. 5 is a block diagram showing an example configuration of a radio frequency circuit according to a second embodiment of the present invention.

FIG. 5 is a block diagram showing an example configuration of a radio frequency circuit according to a second embodiment of the present invention. The difference from the radio frequency circuit according to the first embodiment is that the radio frequency circuit according to the present embodiment includes at least two channels. Specifically, the difference is that the bias terminal 701 is replaced with a controller 70, and that transmission lines 40-2 to 40-n (n is an integer of 2 or larger), depletion layer capacitors 81-2 to 81-n, and output terminals 21-2 to 21-n are further provided.

In addition, a portion enclosed by a dotted line in FIG. 5 (for example, a transistor circuit 51-1 including Tr1-1, Tr2-1, and 81-1) is formed on a semiconductor substrate. The following description will center on the difference from the first embodiment. The description of the same configuration and advantageous effect of the configuration as in the first embodiment will be omitted.

The radio frequency circuit according to the present embodiment is a switch circuit which performs a Single Pole n-Throw (SPnT) operation on one input and n outputs. Each of the switch transistor circuits Tr1-1 to Tr1-n and Tr2-1 to Tr2-n turns on one of the first to the n-th channels by performing switching based on a control signal from the controller 70 while turning off the other channels at the same time, and selects one of the transmission lines 40-1 to 40-n.

According to the second embodiment as described above, since a larger number of transmission lines are included, it is possible to increase the number of types of signals to be transmitted. Thus, the radio frequency circuit according to the second embodiment produces an advantageous effect particularly in a multiband-compatible cellular phone or the like which is compatible with many different radio frequency signals.

Third Embodiment

In a third embodiment, a semiconductor device appropriate for improving isolation will be described as an example.

Figure 6:
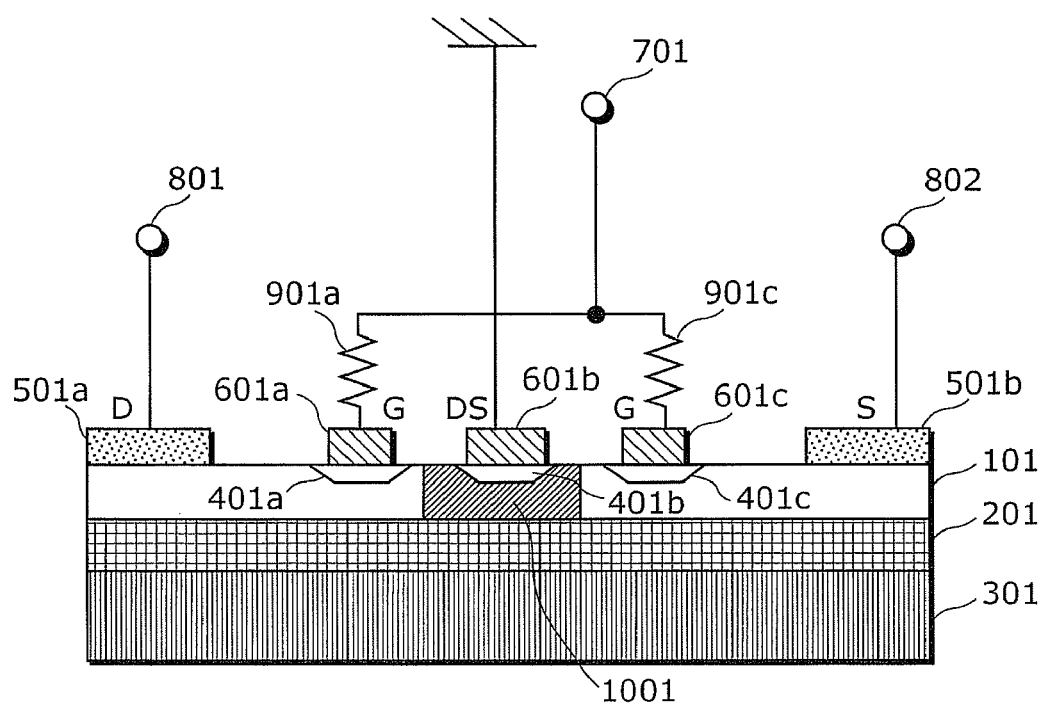
FIG. 6 is a cross-sectional diagram of a semiconductor device according to a third embodiment of the present invention.

FIG. 6 shows a semiconductor device (MESFET) according to the third embodiment of the present invention. The difference from the semiconductor device according to the first embodiment is that the semiconductor device according to the present embodiment includes an injection-doped layer. Specifically, an injection-doped layer 1001 is formed under the Schottky electrode 601b. The following description will center on the difference from the first embodiment. The description of the same configuration and advantageous effect of the configuration as in the first embodiment will be omitted.

The depletion layer 401b, which is provided under the Schottky electrode 601b by forming the injection-doped layer 1001, has a width different from that in the first embodiment. In other words, by controlling the width of the depletion layer 401b through the width of the injection-doped layer 1001, it is possible to change the depletion layer capacitor 81-1 (capacitance of the depletion layer 401b) in FIG. 3 in the first embodiment, to thereby increase the degree of freedom of design for isolation characteristics.

According to the third embodiment as described above, it is possible to increase the degree of freedom of design for isolation characteristics, thus allowing providing a semiconductor device appropriate for multiband, multimode performance.

Fourth Embodiment

In a fourth embodiment, a radio frequency circuit appropriate for multiband performance will be described as an example.

Figure 7:
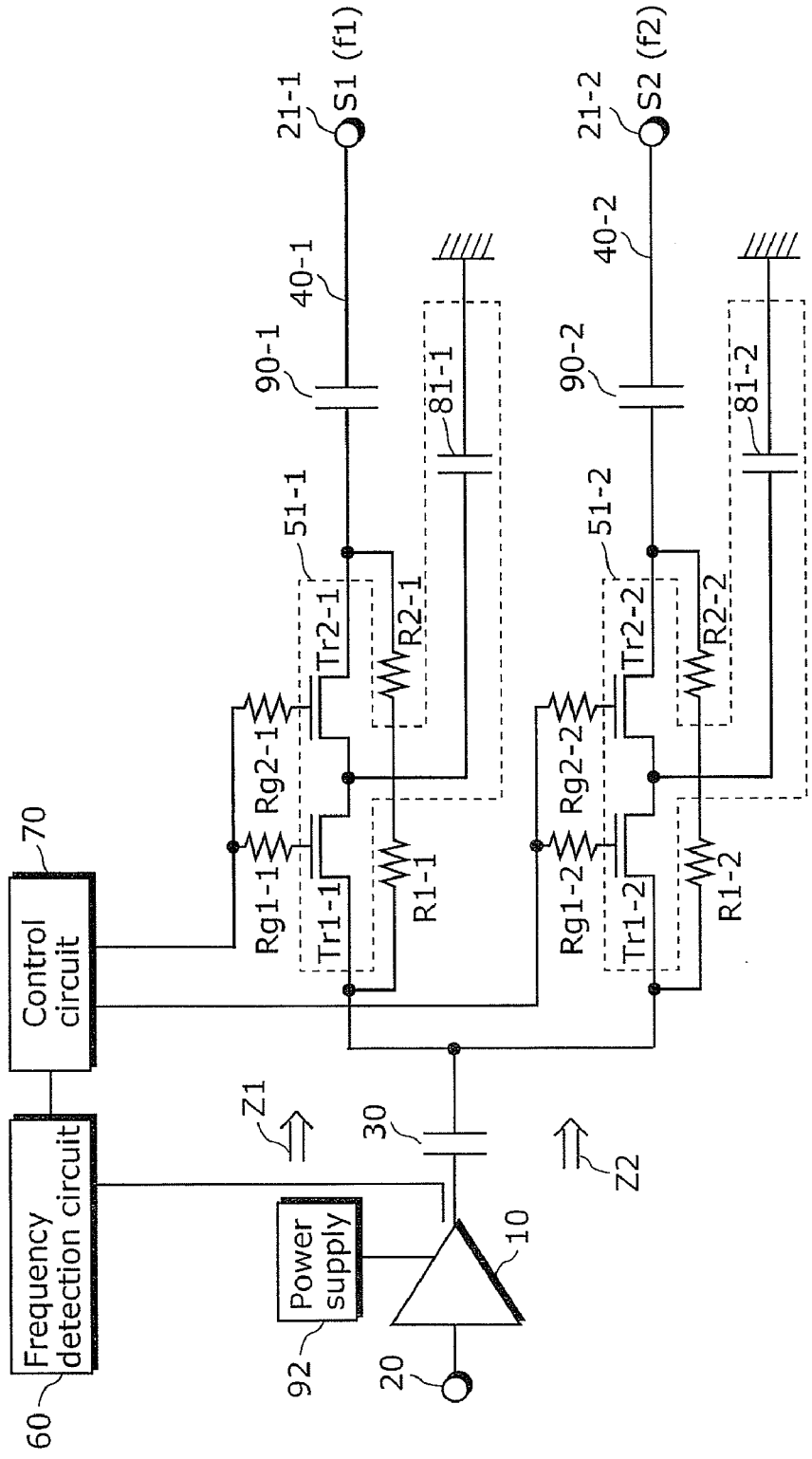
FIG. 7 is a block diagram showing an example configuration of a radio frequency circuit according to a fourth embodiment of the present invention.

FIG. 7 is related to the fourth embodiment of the present invention. The difference from the radio frequency circuit according to the second embodiment shown in FIG. 5 is that the radio frequency circuit according to the fourth embodiment includes an amplifying circuit.

Specifically, the difference is that: the frequency detector 60 is connected to the controller 70; resistors R1-1 and R1-2 and resistors R2-1 and R2-2 for fixing potential are connected, respectively, to the switch transistors Tr1-1 and Tr1-2 and the transmission lines 40-1 and 40-2; and an amplifying circuit 10 and a power supply 92 are connected subsequent to the input terminal 20, and a switch input-side DC-cutting capacitor 30 is provided subsequent to the amplifying circuit 10, and output side DC-cutting capacitors 90-1 and 90-2 are provided subsequent to the transmission lines 40-1 and 40-2, respectively. The following description will center on the difference from the first embodiment. The description of the same configuration and advantageous effect of the configuration as in the first embodiment will be omitted.

An example in FIG. 7 assumes that there are two types of frequencies for a radio frequency signal, with S1 representing a radio frequency signal of frequency f1 and S2 representing a radio frequency signal of frequency f2. Note that the frequencies f1 and f2 are typically different, and it is assumed that f1<f2, for example. As a specific example, it is possible to assume that f1 is 1710 to 1785 MHz which includes Universal Mobile Telecommunications System (UMTS) Band III, and that f2 is 1910 to 1980 MHz which includes UMTS Band I, but the present embodiment is not limited to this. In addition, the example shown in FIG. 7 assumes that: the transmission line is selected according to the frequency of the radio frequency signal; the radio frequency S1 passes through the transmission line 40-1; and the radio frequency S2 passes through the transmission line 40-2.

In addition, the example of FIG. 7 assumes that Z1 is a load impedance at an output side of the amplifying circuit 10 as viewed from the amplifying circuit 10 when the transmission line 40-1 is selected, and Z2 is a load impedance at the output side of the amplifying circuit 10 as viewed from the amplifying circuit 10 when the transmission line 40-2 is selected.

The amplifying circuit 10 is an amplifying circuit in a final stage including an amplifying element, and electrically amplifies the radio frequency signal that is supplied to the input terminal 20, and outputs an amplified signal. The switch input-side DC-cutting capacitor 30 is connected to an output of the amplifying circuit 10. The output of the switch input-side DC-cutting capacitor 30 is connected to the switch circuit.

The switch transistors Tr1-1 and Tr2-1 turn on or off according to a common control signal which is supplied to each gate terminal from the controller 70. Likewise, the switch transistors Tr1-2 and Tr2-2 turn on or off according to the common control signal that is supplied to each gate terminal from the controller 70.

The frequency detector 60 detects a frequency of the amplified signal output from the amplifying circuit 10. Here, as an example, the frequency detector 60 detects the frequency f1 when the amplified signal based on the radio frequency signal S1 is output, and detects the frequency f2 when the amplified signal based on the radio frequency signal S2 is output.

The controller 70 generates a control signal indicating selection information for the transmission line, based on the frequency detected by the frequency detector 60, and supplies the control signal to the gate of each switch transistor.

Specifically, when the frequency f1 is detected, the controller 70 supplies an on-signal to the gates of the switch transistors Tr1-1 and Tr2-1, and supplies an off-signal to the gates of the switch transistors Tr1-2 and Tr2-2. In this case, the amplified signal based on the radio frequency signal S1 passes through a first channel (switch transistors Tr1-1 and Tr2-1, and transmission line 40-1) via the switch input-side DC-cutting capacitor 30, to be output from an output terminal 21-1.

Likewise, when the frequency f2 is detected, the controller 70 supplies an on-signal to the gates of the switch transistors Tr1-2 and Tr2-2, and supplies an off-signal to the gates of the switch transistors Tr1-1 and Tr2-1. In this case, the amplified signal based on the radio frequency signal S2 passes through a second channel (switch transistors Tr1-2 and Tr2-2, and transmission line 40-2), to be output from the output terminal 21-2.

As described earlier, the depletion layer capacitor 81-1 is formed by the depletion layer under the Schottky electrode and contributes to improvement of isolation of the off-channel. Since the improved isolation of the off-channel reduces signal loss in the on-channel, it is possible to obtain satisfactory efficiency.

In addition, since the capacitance in the radio frequency circuit can further contribute to impedance conversion, the depletion layer capacitor 81-1 converts the load impedance Z1 into a load impedance which allows obtaining maximum efficiency and maximum output from the amplifying circuit 10. Likewise, the depletion layer capacitor 81-2 converts the load impedance Z1 into a load impedance which allows obtaining maximum efficiency and maximum output from the amplifying circuit 10.

Hereinafter described is a principle of operation related to the impedance conversion according to the present embodiment of the present invention. As is well known, to optimize the efficiency of the amplifying circuit 10, it is necessary to sufficiently match the input and output impedances under each condition such as the frequency of the amplified signal or an average power. Thus, the target impedance is uniquely determined. Thus, to achieve the radio frequency circuit appropriate for multiband performance, it is necessary to optimize the load impedance for each frequency band of the amplified signal such that the load impedance becomes closer to the target impedance.

Accordingly, in the present embodiment, the load impedance is optimized according to each frequency band of the amplified signal by introducing a corresponding one of the depletion layer capacitors 81-1 and 81-2 for impedance conversion into each of the transmission lines, so as to optimize the load impedance for each frequency band of the amplified signal.

First, the load impedance Z1 when the transmission line 40-1 is selected will be discussed. The switch transistors Tr1-1, Tr2-1, Tr1-2, and Tr2-2 are represented as resistance components when they are on, and as capacitance components when they are off. When the transmission line 40-1 is selected (when the switch transistors Tr1-1 and Tr2-1 are off and the switch transistors Tr1-2 and Tr2-2 are off), the switch transistors Tr1-1 and Tr2-1 are represented as resistance components, and the switch transistors Tr1-2 and Tr2-2 are represented as capacitance components. Note that the resistance component when the switch is on (on-resistance) and the capacitance component when the switch is off (off-capacitance) are constants which depend on a device size of the switch transistor to be used. Here, as an example, it is assumed that each of the switch transistors has an on-resistance of 0.8Ω and an off-capacitance of approximately 0.5 pF, but the values are not limited to these.

The load impedance Z1 is converted into a load impedance which allows obtaining, through the depletion layer capacitor 81-1, maximum efficiency and maximum output from the amplifying circuit 10 at frequency f1.

Next, the load impedance Z2 when the transmission line 40-2 is selected will be discussed. When the transmission line 40-2 is selected (when the switch transistors Tr1-1 and Tr2-1 are off and the switch transistors Tr1-2 and Tr2-2 are on), the switch transistors Tr1-1 and Tr2-1 are represented as capacitance components, and the switch transistors Tr1-2 and Tr2-2 are represented as resistance components. Then, under this condition, the load impedance Z2 is converted into a load impedance which allows obtaining, through the depletion layer capacitor 81-2, maximum efficiency and maximum output from the amplifying circuit 10 at frequency f2.

Next, power added efficiency (PAE) of the amplifying circuit 10 according to the fourth embodiment (FIG. 7) will be compared to the PAE of the amplifying circuit 10 according to the conventional technique. Here, the conventional technique used for the comparison is a case of using the MESFET included in the transistor circuits 51-1 and 51-2 in FIG. 7 by applying, in the conventional manner, the same potential to all the Schottky electrodes without grounding the central Schottky electrode.

Figure 8:
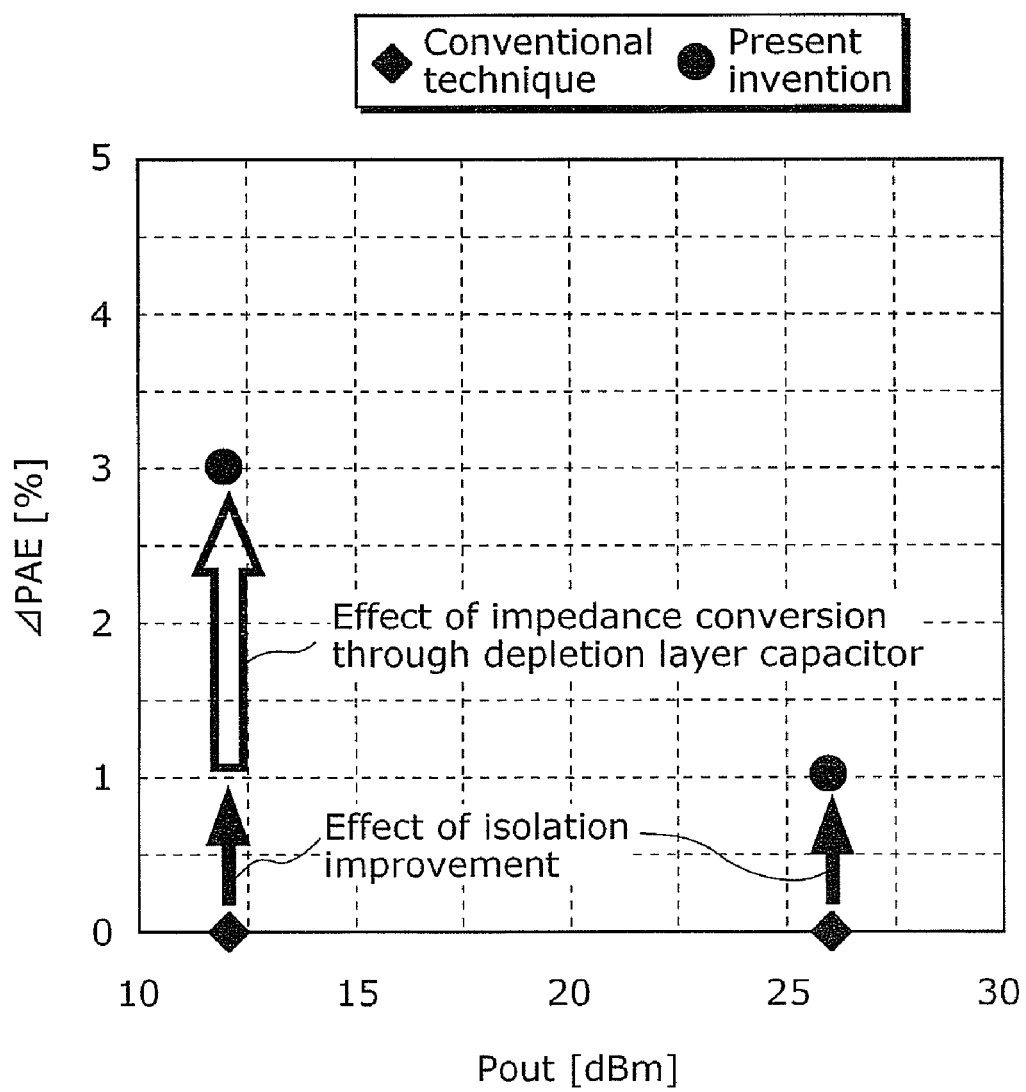
FIG. 8 is a diagram comparing PAE of an amplifying circuit 10 between the fourth embodiment and the conventional technique.

FIG. 8 is a diagram comparing the PAE of the amplifying circuit 10 between the fourth embodiment and the conventional technique. In FIG. 8, it is assumed that it is possible to perform conversion into a load impedance which allows obtaining, through the depletion layer capacitors, maximum efficiency and maximum output when an output power (Pout) from the amplifying circuit 10 is 12 dBm. In addition, the frequency band in FIG. 8 is 2 GHz.

As clearly shown in FIG. 8, the PAE in the fourth embodiment is improved at: Pout=12 dBm and 26 dBm, respectively, compared to the PAE in the conventional technique (here assumed as having a temporary value of 47%). The PAE at Pout=12 dBm is improved by 3% because tuning of load impedance is performed. In addition, due to the effects of isolation improved through the depletion layer capacitors, the PAE is improved by 1% at Pout=12 dBm and 26 dBm, respectively.

As described above, according to the fourth embodiment, it is possible to improve off-channel isolation through the depletion layer capacitors 81-1 and 81-2 while at the same time optimizing the load impedance at each frequency of the amplified signal (that is, for each transmission line that is selected).

Thus, even in the case of using the radio frequency circuit according to the fourth embodiment in a multiband cellular phone or the like which is compatible with different wireless frequency bandwidths, it is possible to perform optimum impedance matching according to the usable frequency band which varies, to thereby separately optimize the amplifying circuit 10 for each frequency. Thus, according to the fourth embodiment, it is possible to provide a radio frequency circuit appropriate for multiband performance.

Fifth Embodiment

Figure 9:
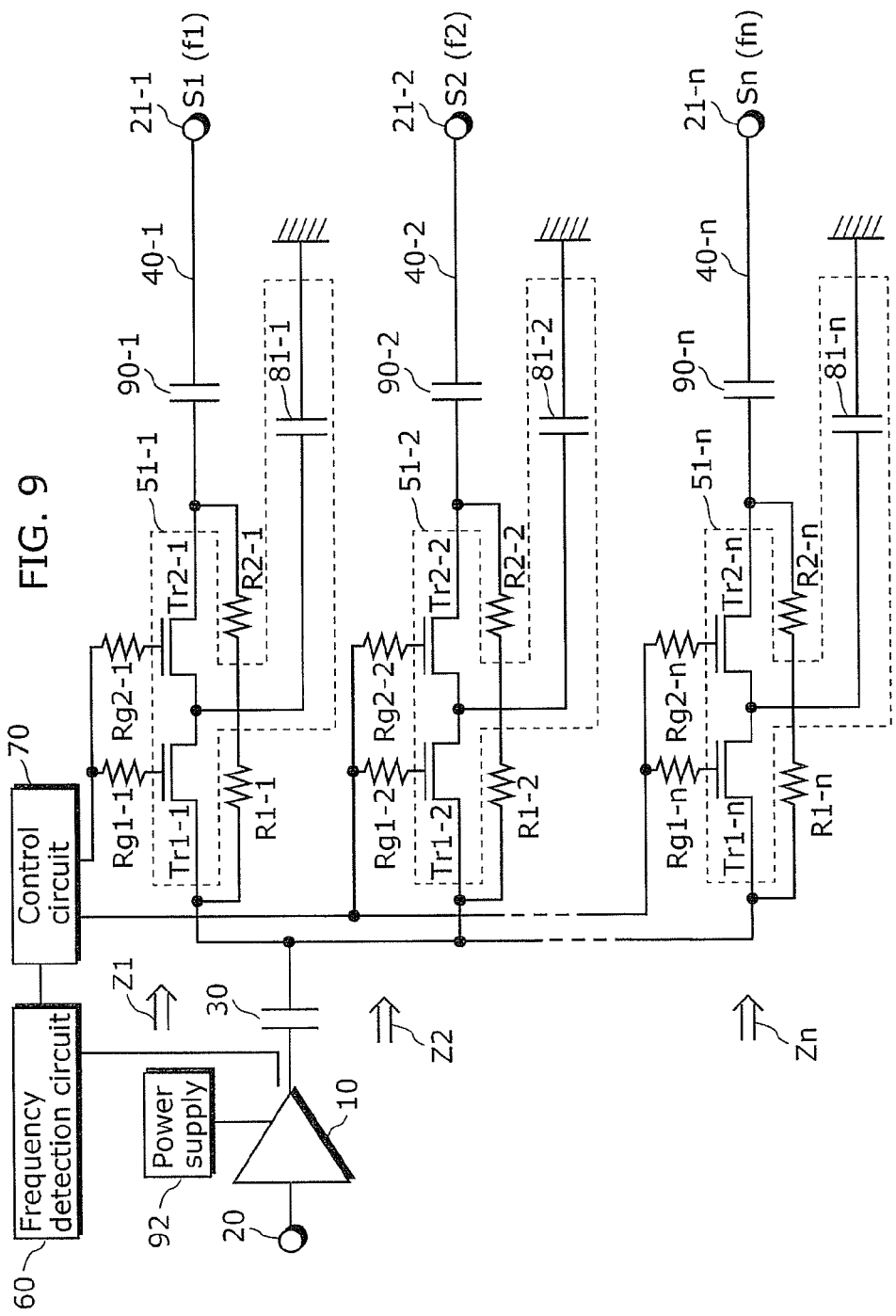
FIG. 9 is a block diagram showing an example configuration of a radio frequency circuit according to a fifth embodiment of the present invention.

FIG. 9 is a block diagram showing an example configuration of a radio frequency circuit according to a fifth embodiment. The difference from the radio frequency circuit according to the fourth embodiment shown in FIG. 7 is that the radio frequency circuit according to the present embodiment includes at least three channels. Specifically, the difference is that: the transmission lines 40-1 to 40-$n$, the depletion layers 81-1 to 81-$n$, and the output terminals 21-1 to 21-$n$ (in each case, n is an integer of 3 or larger) are provided; and there are n types of frequencies for the radio frequency signal, with Sn representing the radio frequency signal of frequency fn and Zn representing a load impedance at the output side of the amplifying circuit 10 as viewed from the amplifying circuit 10 when the transmission line 40-$n$ is selected. The following description will center on the difference from the first embodiment. The description of the same configuration and advantageous effect of the configuration as in the fourth embodiment will be omitted.

A radio frequency circuit according to the present embodiment zo is a switch circuit which performs a Single Pole n-Throw (SPnT) operation on one input and n outputs. One of the transmission lines 40-1 to 40-$n$ is selected by performing switching based on a control signal from the controller 70 and turning on the one of the transmission lines from 40-1 to 40-$n$ while turning off the other channels at the same time. The switch transistors Tr1-1 and Tr2-$n$ turn on or off according to a common control signal supplied to each gate terminal from the controller 70.

The controller 70 generates a control signal indicating selection information for the transmission line, based on the frequency detected by the frequency detector 60, and supplies the control signal to the switch transistors. For example, when the frequency detector 60 detects the frequency f1, the controller 70 supplies an on-signal to the switch transistors Tr1-1 to Tr2-1 and supplies an off-signal to the other switch transistors. Likewise, the depletion layer capacitor 81-$n$ converts the load impedance Zn into an impedance which allows obtaining maximum efficiency and maximum output from the amplifying circuit 10 at frequency fn.

According to the fifth embodiment as described above, since a larger number of channels (transmission lines) are included, it is possible to increase the number of different frequencies of the amplified signal on which the load impedance can be optimized. Thus, the radio frequency circuit according to the fifth embodiment is particularly useful for a multiband-compatible cellular phone or the like which can deal with many different radio frequency signals.

Sixth Embodiment

Figure 10:
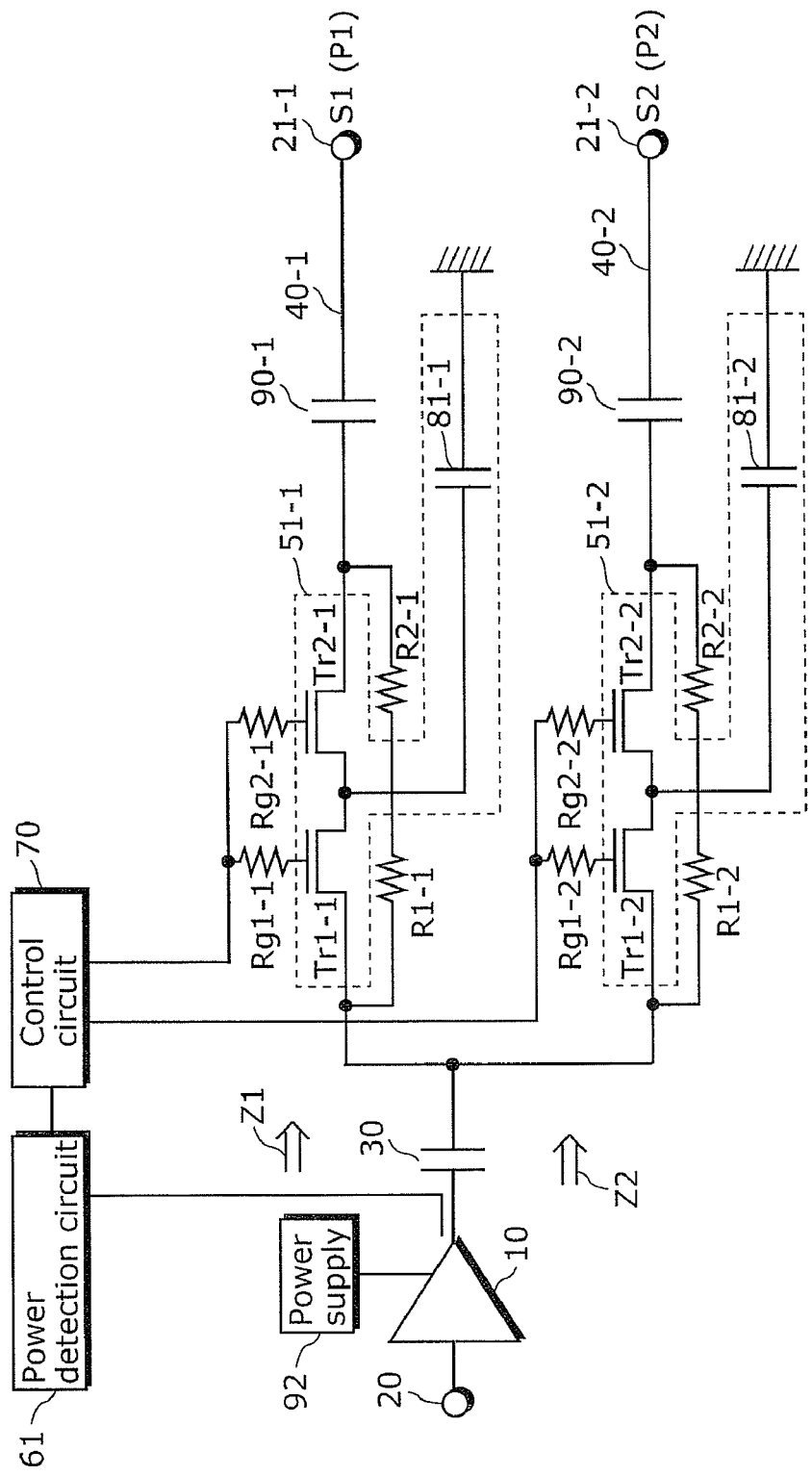
FIG. 10 is a block diagram showing an example configuration of a radio frequency circuit according to a sixth embodiment of the present invention.

FIG. 10 is a block diagram showing an example configuration of a radio frequency circuit according to a sixth embodiment. The radio frequency circuit according to the present embodiment is different from the radio frequency circuit according to the fourth embodiment shown in FIG. 7 in that: the frequency detector 60 is replaced with a power detector 61; and the transmission line is selected according to an average power. The following description will center on the difference from the fourth embodiment. The description of the same configuration and advantageous effect of the configuration as in the fourth embodiment will be omitted.

The frequency detector 61 detects an average power of the amplified signal output from the amplifying circuit 10. An example in FIG. 10 assumes that there are two types of average powers for a radio frequency signal, with S1 representing a radio frequency signal having an average power P1 and S2 representing a radio frequency signal having an average power P2. Note that the average powers P1 and P2 are typically different, and it is assumed that P1<P2, for example. In addition, the example shown in FIG. 10 assumes that the controller 70 selects the transmission line according to the average power of the radio frequency signal, and assumes that the radio frequency S1 passes through the transmission line 40-1, and that the radio frequency S2 passes through the transmission line 40-2.

The frequency detector 61 detects an average power of the amplified signal output from the amplifying circuit 10. Here, as an example, the power detector 61 detects the average power P1 when the radio frequency signal S1 is output, and detects the average power P2 when the radio frequency signal S2 is output.

The controller 70 generates a control signal indicating selection information for the transmission line, based on the average power detected by the power detector 61, and supplies the control signal to the gate of each switch transistor.

Specifically, when the power detector 61 detects the average power P1, the controller 70 supplies an on-signal to the gates of the switch transistors Tr1-1 and Tr2-1, and supplies an off-signal to the gates of the switch transistors Tr1-2 and Tr2-2. With this, the switch transistors Tr1-1 and Tr2-1 in the first channel turn on, and the switch transistors Tr1-2 and Tr2-2 in the second channel turn off.

In this case, the radio frequency signal S1 amplified by the amplifying circuit 10 passes through the first channel (switch transistors Tr1-1 and Tr2-1, and transmission line 40-1) via the switch input-side DC-cutting capacitor 30, to be output from the output terminal 21-1.

Likewise, when the power detector 61 detects the average power P2, the controller 70 supplies an off-signal to the gates of the switch transistors Tr1-1 and Tr2-1, and supplies an on-signal to the gates of the switch transistors Tr1-2 and Tr2-2. With this, the switch transistors Tr1-1 and Tr2-1 in the first channel turn off, and the switch transistors Tr1-2 and Tr2-2 in the second channel turn on.

In this case, the radio frequency signal S2 amplified by the amplifying circuit 10 passes through the second channel (switch transistors Tr1-2 and Tr2-2, and transmission line 40-2) via the switch input-side DC-cutting capacitor 30, to be output from the output terminal 21-2.

The depletion layer capacitor 81-1 converts the load impedance Z1 into an impedance which allows obtaining maximum efficiency and maximum output from the amplifying circuit 10 at average power P1.

Likewise, the depletion layer capacitor 81-2 converts the load impedance Z2 into an impedance which allows obtaining maximum efficiency and maximum output from the amplifying circuit 10 at average power P2.

As described above, according to the sixth embodiment, the load impedance is optimized for each average power of the amplified signal through the depletion layer capacitors 81-1 and 81-2. Thus, even in the case of using the radio frequency circuit according to the sixth embodiment in a multiband cellular phone or the like which is compatible with plural types of communication modes, it is possible to perform optimum impedance matching according to the average power of the amplified signal in the different communication modes, to thereby separately optimize the amplifying circuit 10 for each average power.

Thus, according to the sixth embodiment, it is possible to provide a radio frequency circuit appropriate for multiband performance.

Seventh Embodiment

Figure 11:
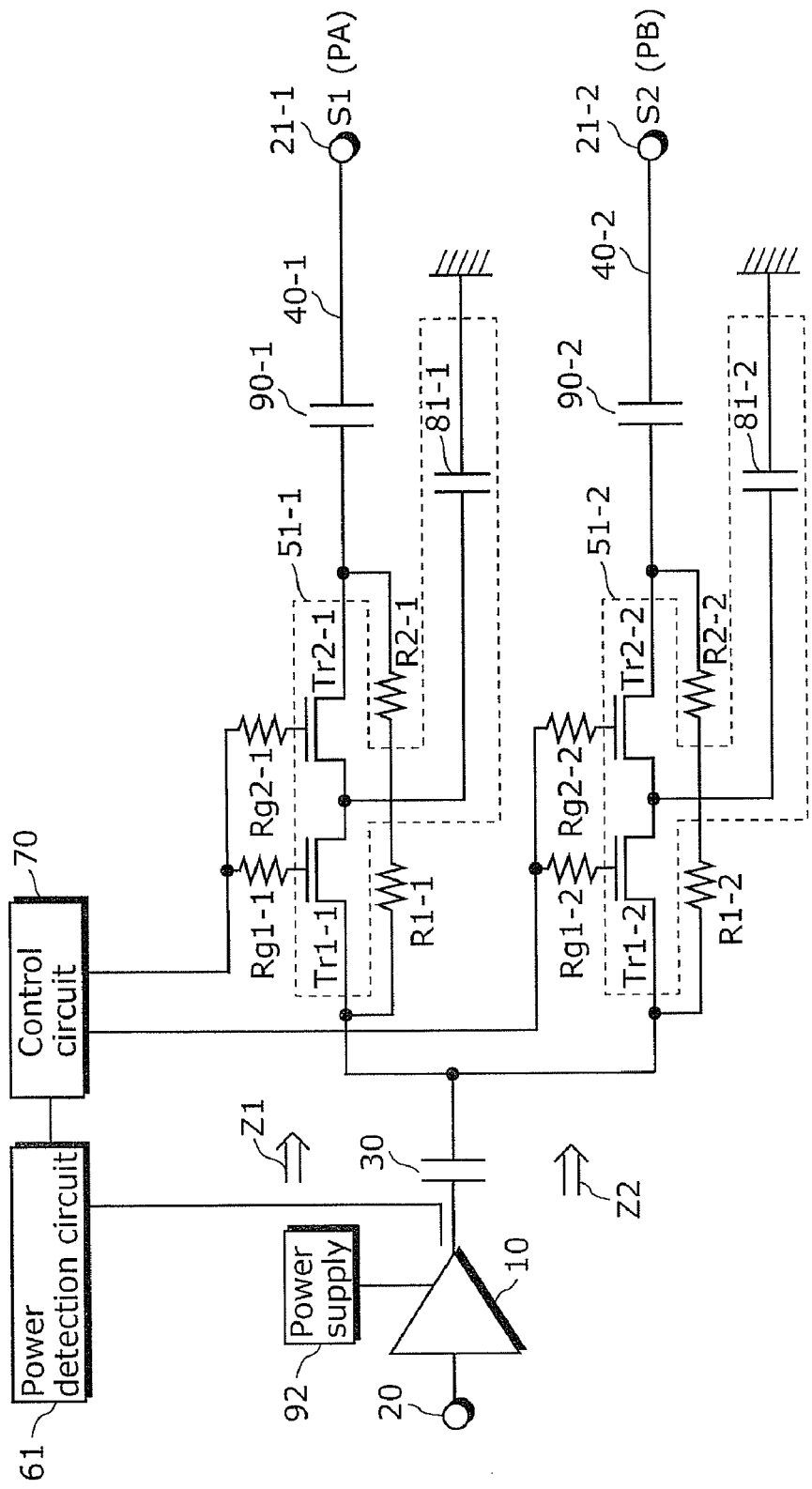
FIG. 11 is a block diagram showing an example configuration of a radio frequency circuit according to a seventh embodiment of the present invention.

FIG. 11 is a block diagram showing an example configuration of a radio frequency circuit according to a seventh embodiment of the present invention. The radio frequency circuit according to the present embodiment is different from the radio frequency circuit according to the fourth embodiment shown in FIG. 7 in that: the frequency detector 60 is replaced with a power detector 61; and the transmission line is selected according to a peak power of the amplified signal. The following description will center on the difference from the fourth embodiment. The description of the same configuration and advantageous effect of the configuration as in the fourth embodiment will be omitted.

The example shown in FIG. 11 assumes that there are two types of peak powers for a radio frequency signal, with S1 representing a radio frequency signal having a peak power PA and S2 representing a radio frequency signal having a peak power PB. Note that the peak power PA and the peak power PB are typically different, and it is assumed that PA<PB, for example. In addition, the example shown in FIG. 11 assumes that the transmission line is selected according to the peak power of the radio frequency signal, and assumes that the radio frequency S1 passes through the transmission line 40-1 and the radio frequency S2 passes through the transmission line 40-2.

The power detector 61 detects the peak power of the amplified signal output from the amplifying circuit 10. Here, as an example, the power detector 61 detects the peak power PA when the radio frequency signal S1 is output, and detects the peak power PB when the radio frequency signal S2 is output.

The controller 70 generates a control signal indicating selection information for the transmission line, based on the peak power detected by the power detector 61, and supplies the control signal to the gate of each switch transistor.

Specifically, when the power detector 61 detects the peak power PA, the controller 70 supplies an on-signal to the gates of the switch transistors Tr1-1 and Tr2-1, and supplies an off-signal to the gates of the switch transistors Tr1-2 and Tr2-2. With this, the switch transistors Tr1-1 and Tr2-1 in the first channel turn on, and the switch is transistors Tr1-2 and Tr2-2 in the second channel turn off.

In this case, the radio frequency signal S1 amplified by the amplifying circuit 10 passes through the first channel (switch transistors Tr1-1 and Tr2-1, and transmission line 40-1) via the switch input-side DC-cutting capacitor 30, to be output from the output terminal 21-1.

Likewise, when the power detector 61 detects the average power P2, the controller 70 supplies an off-signal to the gates of the switch transistors Tr1-1 and Tr2-1, and supplies an on-signal to the gates of the switch transistors Tr1-2 and Tr2-2. With this, the switch transistors Tr1-1 and Tr2-1 in the first channel turn off, and the switch transistors Tr1-2 and Tr2-2 in the second channel turn on.

In this case, the radio frequency signal S2 amplified by the amplifying circuit 10 passes through the second channel (switch transistors Tr1-2 and Tr2-2, and transmission line 40-2) via the switch input-side DC-cutting capacitor 30, to be output from the output terminal 21-2.

The depletion layer capacitor 81-1 converts the load impedance Z1 into an impedance which allows obtaining maximum efficiency and maximum output from the amplifying circuit 10 at peak power PA.

The depletion layer capacitor 81-2 converts the load impedance Z2 into an impedance which allows obtaining maximum efficiency and maximum output from the amplifying circuit 10 at peak power PB.

Hereinafter, the impedance conversion in each impedance conversion circuit will be described with a specific example.

Figure 12A:
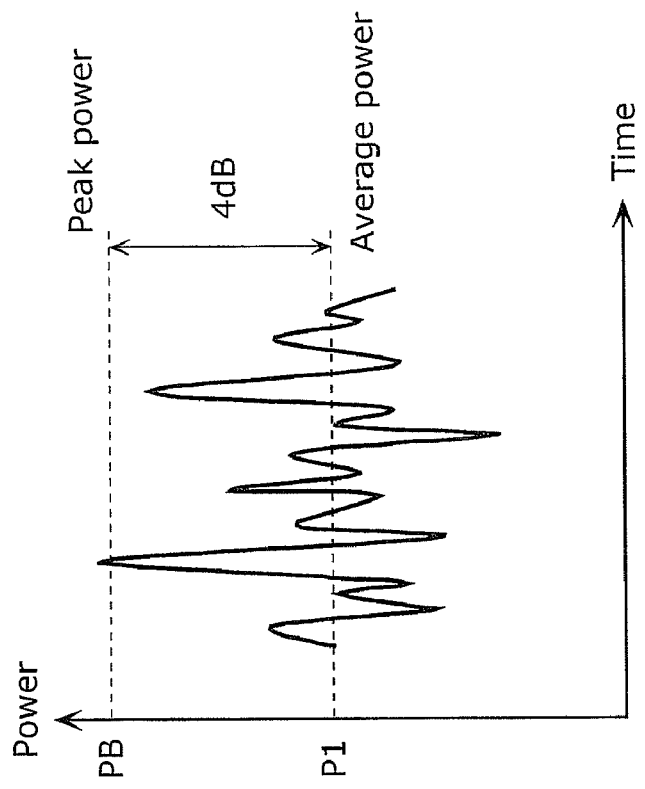
FIG. 12A is a waveform chart showing a time course of power of an amplified signal output from the amplifying circuit 10.
Figure 12B:
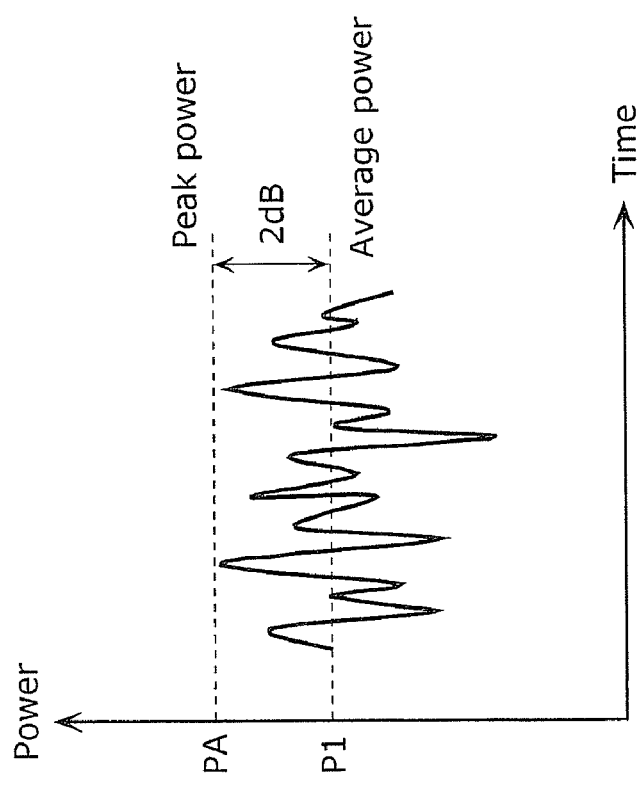
FIG. 12B is a waveform chart showing a time course of power of an amplified signal output from the amplifying circuit 10.

FIGS. 12A and 12B are waveform charts each showing a time course of power of an amplified signal output from the amplifying circuit 10. The amplitude of the amplified signal varies with time when the amplified signal output from the amplifying circuit 10 is a modulated signal which is modulated by a modulation method such as code division multiple access (CDMA) and orthogonal frequency division multiplexing (OFDM). FIG. 12A shows that the peak power PA of the amplified signal is higher than the average power P1 by approximately 2 dB, and FIG. 2B shows that the peak power PB of the amplified signal is higher than the average power P1 by approximately 4 dB.

For such a modulated signal having a fluctuating amplitude, when a distortion rate of the amplified signal can be reduced, a disturbing signal outside the frequency band can also be reduced. To achieve this, it is necessary to linearly amplify the input signal up to the peak power in the amplifying circuit 10. However, for example, the power efficiency of the amplifying circuit 10 declines when the amplifying circuit 10, which can linearly amplify the input signal to the peak power PB as shown in FIG. 12B, is only used up to the peak power PA as shown in FIG. 12A.

FIGS. 13A and 13B are characteristics diagrams indicating, respectively, power efficiency in the case of generating the amplified signal shown in 12B and 12A.

In FIG. 13A, an operation curve LB indicated by a heavy solid line is defined by the average power P1 and the peak power PB according to a maximum power in the range of linear operation RLN in the amplifying circuit 10. E1 represents an average power efficiency at average power P1, and EB represents a peak power efficiency at peak power PB.

In FIG. 13B, the operation line LA indicated by a heavy solid line is defined by the peak power P1 and the peak power PA which is lower than the peak power PB. The average power efficiency at average power P1 is E1, and the peak power efficiency at peak power PB is EA which is lower than EB. The state of the amplifying circuit 10 as indicated by the operation line LB is referred to as a high peak power mode, and the state as indicated by the operation line LA is referred to as a low peak power mode.

As described above, in spite of the amplified signal having the peak power PA which is lower than PB, the operation line LA indicates the average power efficiency E1 equivalent to that of the operation line LB because the peak power efficiency EA is lower than EB.

Accordingly, as shown by the operation curve LC indicated by a heavy solid line in FIG. 13C, when setting the peak power efficiency to EB at peak power PA by reducing the range of linear operation RLN from the peak power PB or less to peak power PA or less, the peak power efficiency at average power P1 becomes E2 that is higher than E1, thus achieving improved power efficiency in the amplifying circuit 10.

Thus, in the specific example described above, it is possible to achieve improved power efficiency in the amplifying circuit 10 by the depletion layer capacitor 81-1 reducing the range of linear operation RLN from the peak power PB or less to the peak power PA or less, and converting the load impedance Z1 into a load impedance which allows converting, to EB, the peak power efficiency at peak power PA.

As described above, according to the seventh embodiment, the load impedance is optimized for each peak power of the amplified signal through the depletion layer capacitors 81-1 and 81-2. Thus, in the case of using the radio frequency circuit according to the seventh embodiment in a multimode cellular phone or the like which is compatible with different modulation systems, it is also possible to perform optimum impedance matching according to different modulation systems, to thereby separately optimize the amplifying circuit 10 for each modulation system. Thus, according to the seventh embodiment, it is possible to provide a radio frequency circuit appropriate for multimode performance.

Eighth Embodiment

Figure 14:
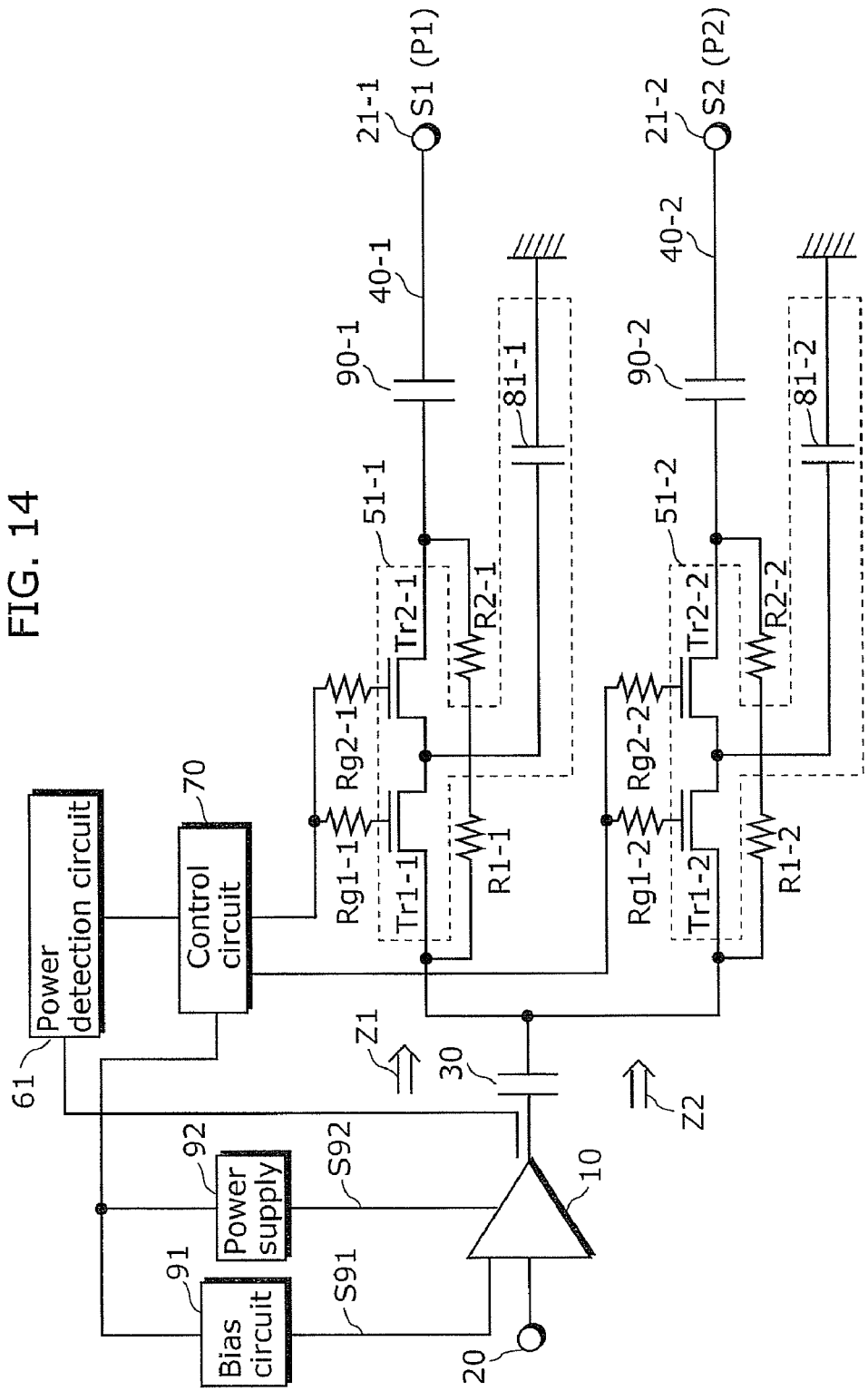
FIG. 14 is a block diagram showing an example configuration of a radio frequency circuit according to an eighth embodiment of the present invention.

FIG. 14 is a block diagram showing an example configuration of a radio frequency circuit according to an eighth embodiment of the present invention. The difference from the radio frequency circuit according to the sixth embodiment shown in FIG. 10 is that the radio frequency circuit according to the present embodiment further includes a bias circuit 91 and a supply circuit 92. The following description will center on the difference from the sixth embodiment. The description of the same configuration and advantageous effect of the configuration as in the sixth embodiment will be omitted.

The controller 70 generates a control signal indicating the average power detected by the power detector 61, and supplies the control signal to the bias circuit 91 and the supply circuit 92.

The bias circuit 91 supplies, to the amplifying circuit 10, a bias output S91 according to the average power indicated by the control is signal from the controller 70. The bias output S91 is an output representing one of a bias current at the input terminal of the amplifying circuit 10 and a bias voltage between the input terminal and a common terminal. In addition, the bias output S91, for example, is an output proportionate to the average power indicated by the control signal from the controller 70.

The supply circuit 92 supplies, to the amplifying circuit 10, a supply voltage S92 according to the average power indicated by the control signal from the controller 70. In addition, the supply voltage S92, for example, is an output proportionate to the average power indicated by the control signal from the controller 70.

As described above, according to the eighth embodiment, while the load impedance for each average power of the amplified signal is being optimized, the bias output S91 and the supply voltage S92, which are to be supplied to the amplifying circuit 10, are concurrently optimized according to the average power. With this, the power efficiency of the amplifying circuit 10 is further improved, and the distortion of the amplifying circuit 10 is further reduced.

Ninth Embodiment

In a ninth embodiment, a range of a circuit including a semiconductor chip will be described in the case where the radio frequency circuit according to the fourth to the eighth embodiments is configured as a semiconductor device. Note that the following will describe a radio frequency circuit according to the fifth embodiment as an example.

In the ninth embodiment shown in FIG. 9, at least a part of the switch transistors includes a single semiconductor chip. Each of the switch transistors (Tr1-1 and so on) is formed of a field-effect transistor (FET). Particularly, when each of the switch transistors is formed of a high electron mobility transistor (HEMT), on-resistance per chip area becomes smaller than in FET, thereby reducing a signal loss in passing of the signal as well as reducing the chip area.

Furthermore, by forming, on the semiconductor chip, a capacitor and an inductor to be used for impedance conversion circuits 80-1 to 80-n, it is possible to form a multifunctional and high-performance radio frequency circuit within a further integrated semiconductor device which is smaller in area, thus producing a significant advantageous effect of achieving a compact and highly efficient radio frequency circuit. Furthermore, to simplify the radio frequency circuit, it is preferable to incorporate the controller 70 in the semiconductor chip.

As described above, according to the ninth embodiment, by forming at least a part of the switch transistors using a single semiconductor chip, it is possible to reduce the size and cost of the radio frequency circuit and the radio frequency power amplifier including the radio frequency circuit.

Note that the semiconductor chip according to the ninth embodiment, the amplifying circuit 10, and the switch input-side DC-cutting capacitor 30 may be mounted on the substrate made of resin or a ceramic material.

In addition, in all the embodiments described above, the switch transistors in each selection circuit are formed of an FET, but may also be formed of another switch such as: HEMT, positive-intrinsic-negative (PIN) diode, or micro-electro-mechanical systems (MEMS). Furthermore, the switch transistors included in each selection circuit and each transistor circuit may be formed of a single chip or plural chips.

In addition, in all the embodiments described above, the amplifying element in the amplifying circuit 10 is formed of a bipolar transistor, but may also be formed of another transistor such as: a hetero bipolar transistor, a silicon germanium transistor, an FET, and an insulated gate bipolar transistor (IGBT). Furthermore, these transistors included in the amplifying circuit 10 may be formed in a single piece or in plural pieces. Furthermore, the amplifying circuit 10 may have a multistage configuration. In the case of configuring the amplifying circuit 10 using these transistors, an emitter ground or a source ground is typically used. In this case, the input terminal is a base terminal or a gate terminal, the output terminal is a collector terminal or a drain terminal, and the common terminal is an emitter terminal or a source terminal.

The embodiments described thus far are mere examples to specifically illustrate the present invention, and the present invention is not limited to these examples but can be developed into various examples which are easily configurable by those skilled in the art using the techniques described in the present invention.

INDUSTRIAL APPLICABILITY

A semiconductor device according to an implementation of the present invention and a radio frequency circuit including the semiconductor device are appropriate for multiband, multimode performance, and are applicable to a mobile terminal device and so on.

What is claimed is:

1. A semiconductor device including a field-effect transistor formed on a semiconductor substrate, said semiconductor device comprising:
a first ohmic electrode and a second ohmic electrode serving as a source electrode and a drain electrode of said field-effect transistor;
a first Schottky electrode and a second Schottky electrode which are provided between said first and said second ohmic electrodes and serve as gate electrodes of said field-effect transistor; and
a third Schottky electrode provided between said first and said second Schottky electrodes,
wherein said third Schottky electrode is grounded.

2. The semiconductor device according to claim 1, wherein said first and said second Schottky electrodes are connected to each other.

3. The semiconductor device according to claim 1, wherein an injection-doped layer is formed directly beneath said third Schottky electrode.

4. A radio frequency circuit comprising:
an amplifying circuit which amplifies a radio frequency signal and outputs the amplified signal;
a capacitor having a first end connected to an output of said amplifying circuit; and
the conductor device according to claim 1, having the first ohmic electrode connected to a second end of said capacitor.

5. The radio frequency circuit according to claim 4, comprising
a plurality of said semiconductor devices,
wherein each of said plurality of semiconductor devices has the first ohmic electrode connected to the second end of said capacitor.

6. The radio frequency circuit according to claim 5, further comprising:
a detector which detects an amount of predetermined characteristics of the amplified signal; and
a controller which turns on one of field-effect transistors according to the amount of the predetermined characteristics detected by said detector and which turns off the others, said field-effect transistors being included in said plurality of semiconductor devices.

7. The radio frequency circuit according to claim 6, wherein said detector detects a frequency of the amplified signal as the amount of the predetermined characteristics.

8. The radio frequency circuit according to claim 6, wherein said detector detects an average power of the amplified signal as the amount of the predetermined characteristics.

9. The radio frequency circuit according to claim 8, further comprising
a bias circuit which supplies, to said amplifying circuit, a bias output representing a bias current or a bias voltage according to the average power of the amplified signal detected by said detector.

10. The radio frequency circuit according to claim 9, further comprising
a supply circuit which supplies, to said amplifying circuit, a supply voltage according to the average power of the amplified signal detected by said detector.

11. The radio frequency circuit according to claim 6, wherein said detector detects a peak power of the amplified signal as the amount of the predetermined characteristics.

12. The radio frequency circuit according to claim 11, further comprising
a bias circuit which supplies, to said amplifying circuit, a bias output representing a bias current or a bias voltage according to the peak power of the amplified signal detected by said detector.

13. The radio frequency circuit according to claim 12, further comprising
a supply circuit which supplies, to said amplifying circuit, a supply voltage according to the peak power of the amplified signal detected by said detector.

14. A radio frequency power amplifier comprising the radio frequency circuit according to claim 6,
wherein in said radio frequency circuit, said field-effect transistors and at least part of said amplifying circuit are formed on said semiconductor substrate.

* * * * *